United States Patent [19]
Krueger et al.

[11] Patent Number: 5,911,560
[45] Date of Patent: Jun. 15, 1999

[54] GETTER PUMP MODULE AND SYSTEM

[75] Inventors: Gordon Krueger, Nipoma; D'Arcy H. Lorimer, Pismo Beach, both of Calif.; Sergio Carella, Varese; Andrea Conte, Milan, both of Italy

[73] Assignee: SAES Pure Gas, Inc., San Luis Obispo, Calif.

[21] Appl. No.: 08/348,798

[22] Filed: Dec. 2, 1994

Related U.S. Application Data

[63] Continuation-in-part of application No. 08/332,564, Oct. 31, 1994, Pat. No. 5,685,963.

[51] Int. Cl.$^6$ ...................................................... F04B 37/02
[52] U.S. Cl. .................................. 417/48; 417/49; 417/51
[58] Field of Search .................................. 417/48, 49, 51

[56] References Cited

U.S. PATENT DOCUMENTS

| | | | |
|---|---|---|---|
| 2,965,218 | 12/1960 | Jayne | 417/51 |
| 3,203,901 | 8/1965 | della Porta | 252/181.6 |

(List continued on next page.)

FOREIGN PATENT DOCUMENTS

| | | |
|---|---|---|
| 0 144 522 A2 | 6/1985 | European Pat. Off. . |
| 0 246 158 A1 | 11/1987 | European Pat. Off. . |
| 0693626A1 | 1/1996 | European Pat. Off. . |
| 2 370 357 | 6/1978 | France . |
| 2511709 | 8/1981 | France . |
| 1 011 996 | 7/1957 | Germany . |
| 2204714 | 10/1979 | Germany . |
| 4110588A1 | 10/1992 | Germany . |
| 58-117372 | 7/1983 | Japan . |
| 60-222572 | 11/1985 | Japan . |
| 62-113876 | 5/1987 | Japan . |
| 62-258176 | 11/1987 | Japan . |
| 4-5480 | 4/1990 | Japan . |
| 3189380 | 8/1991 | Japan . |
| 5099538 | 4/1993 | Japan . |
| 7249500 | 9/1995 | Japan . |
| 6-117019 | 12/1995 | Japan ............................................. 37/2 |
| 1168263 | 10/1969 | United Kingdom . |
| 1 329 628 | 9/1973 | United Kingdom . |
| 2 077 487 | 12/1981 | United Kingdom . |
| 2077487 | 12/1981 | United Kingdom . |
| 2 100 143 | 12/1982 | United Kingdom . |
| 94/02957 | 2/1994 | WIPO . |
| WO94/02958 | 2/1994 | WIPO . |
| 96/13620 | 5/1996 | WIPO . |

OTHER PUBLICATIONS

Briesacher, J. et al., "Non–Evaporable Getter Pumps for Semiconductor Processing Equipment," Department of Electronics, Faculty of Engineering, Tohoku University, pp. 49–57.

della Porta, Paolo, "Gettering, an Integral Part of Vacuum Technology," American Vacuum Society 39th National Symposium, Nov. 9–13, 1992.

Briesacher et al., "Recommended Pumping Semiconductor Manufacturing" Kayoiku Kaikan, 'Applications for Non–Evaporable Getter Pumps in Semiconductor Processing Equipment' 10th Symposium on ULSI Ultra Clean Technology, Nov. 9–10, 1989.

(List continued on next page.)

*Primary Examiner*—Timothy Thorpe
*Assistant Examiner*—Cheryl J. Tyler
*Attorney, Agent, or Firm*—Hickman & Martine, LLP

[57] ABSTRACT

A getter pump module includes a number of getter disks provided with axial holes, and a heating element which extends through the holes to support and heat the getter disks. The getter disks are preferably solid, porous, sintered getter disks that are provided with a titanium hub that engages the heating element. A thermally isolating shield is provided to shield the getter disks from heat sources and heat sinks within the chamber, and to aid in the rapid regeneration of the getter disks. In certain embodiments of the present invention the heat shields are fixed, and in other embodiments the heat shield is movable. An embodiment of the present invention also provides for a rotating getter element to enhance getter material utilization.

24 Claims, 10 Drawing Sheets

U.S. PATENT DOCUMENTS

| | | | |
|---|---|---|---|
| 3,662,522 | 5/1972 | Della Porta et al. | 55/387 |
| 3,780,501 | 12/1973 | Porta et al. | 55/208 |
| 3,820,919 | 6/1974 | Katz | 417/48 |
| 3,892,650 | 7/1975 | Cuomo et al. | 204/192 |
| 3,926,832 | 12/1975 | Barosi | 252/181.6 |
| 3,961,897 | 6/1976 | Giorgi et al. | 417/51 |
| 4,062,319 | 12/1977 | Roth et al. | 118/49.1 |
| 4,071,335 | 1/1978 | Barosi | 55/68 |
| 4,137,012 | 1/1979 | della Porta et al. | 417/51 |
| 4,181,161 | 1/1980 | Kraus | 141/8 |
| 4,269,624 | 5/1981 | Figini | 75/177 |
| 4,306,515 | 12/1981 | Winkler | 118/724 |
| 4,306,887 | 12/1981 | Barosi et al. | 55/68 |
| 4,312,669 | 1/1982 | Boffito et al. | 75/177 |
| 4,405,487 | 9/1983 | Harrah et al. | 252/194 |
| 4,428,856 | 1/1984 | Boyarina et al. | 252/181.1 |
| 4,449,373 | 5/1984 | Peterson et al. | 62/55.5 |
| 4,460,673 | 7/1984 | Sukigara et al. | 430/128 |
| 4,515,528 | 5/1985 | Young | 417/51 |
| 4,571,158 | 2/1986 | Maegdefessel | 417/51 |
| 4,704,301 | 11/1987 | Bauer et al. | 427/38 |
| 4,907,948 | 3/1990 | Barosi et al. | 417/53 |
| 5,015,226 | 5/1991 | Polaschegg | 604/4 |
| 5,238,469 | 8/1993 | Briesacher et al. | 95/115 |
| 5,242,559 | 9/1993 | Giorgi | 204/181.4 |
| 5,254,096 | 10/1993 | Rondelet et al. | 604/152 |
| 5,320,496 | 6/1994 | Manini et al. | 417/51 |
| 5,340,460 | 8/1994 | Kobayashi et al. | 204/298.09 |
| 5,357,760 | 10/1994 | Higham | 62/55.5 |

OTHER PUBLICATIONS

"SORB–AC® Getter Wafer Modules and Panels", S.A.E.S. Getters S.p.A., Italy, Oct. 1988.

Porta et al., "The Characteristics of Getter Pumps, Getter Ion Pumps and their Combination" SAES Technical Report TR (SAES Getters S.p.A.), pp. 3–4.

Lorimer et al., "Enhanced UHV Performance with Zirconium–Based Getters", Solid State Technology, pp. 3–5, Sep. 1990.

Ferrario et al., "Chemical Pumping and its Applications in High and Ultra High Vacuum", Le Vide, les Couches Minces–Supplement au n° 252, May–Jul. 1990, p. 105.

Farrario, B., "Use of Getters in Vacuum Systems—Extended Abstract", Vacuum, vol. 37, No. 3/4, pp. 375–377, 1987.

Sciuccati, F. et al., "In situ Pumping with NEG (non–evaporable getters) during Vacuum Processing", Vacuum, vol. 38, Nos. 8–10, pp. 765–769, 1988.

Cecchi, J.L., "Impurity Control in TFTR", Journal of Nuclear Materials, vol. 93 & 94, pp. 28–43, 1980.

Ferrario, B. "Non–evapporable Getters in Plasma and Particle Physics Experiments", SAES Getters S.p.A., pp. 184–187, Bombay, India, 1983.

Ferrario et al., "New Types of Volume Gettering Panels for Vacuum Problems in Plasma Machines", Proceedings of the 7th International Vacuum Congress & 3rd International Conference of Solid Surfaces, pp. 359–362, Vienna 1977.

Giorgi, T. et al., "An Updated Review of Getters and Gettering", Journal of Vacuum Science and Technology A, vol. 3, No. 2, pp. 417–423 Mar./Apr. 1985.

"System Grows Complex Single Crystal Materials", Solid State Technology, vol. 26, No. 7, pp. 39–40, Jul. 1983.

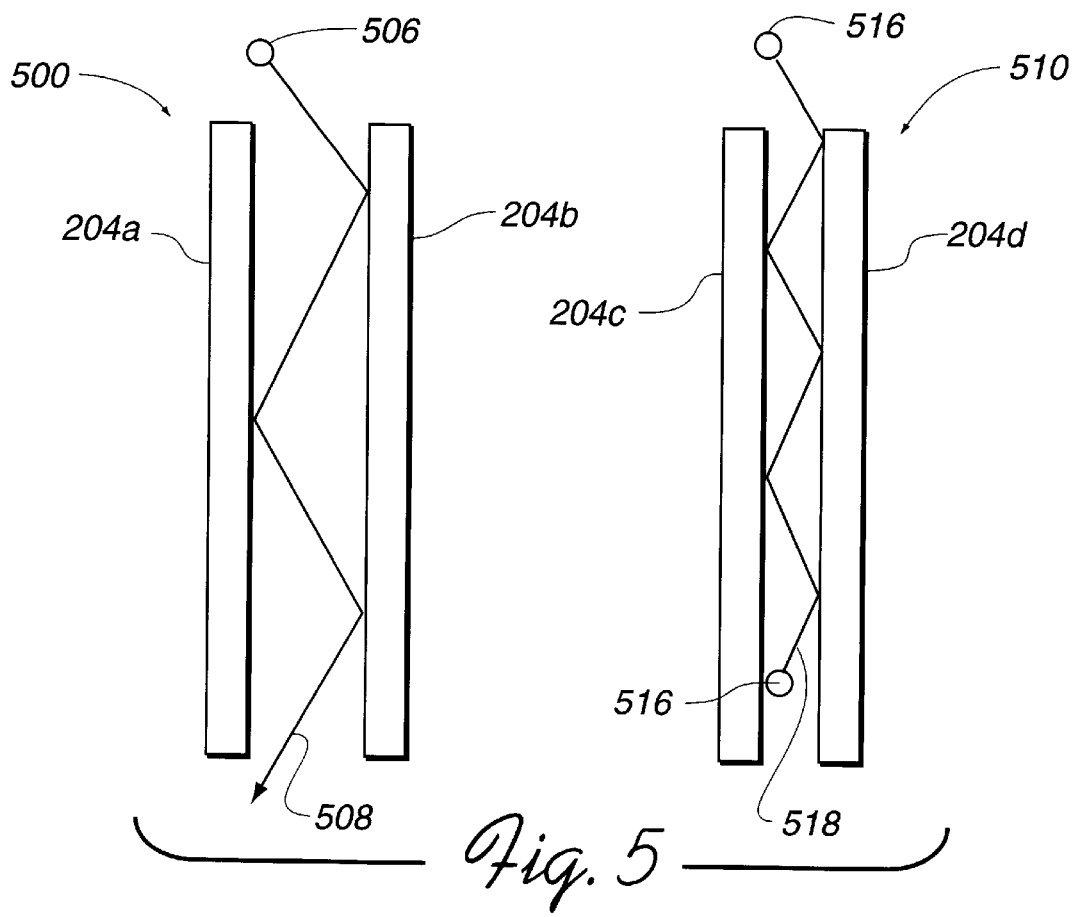
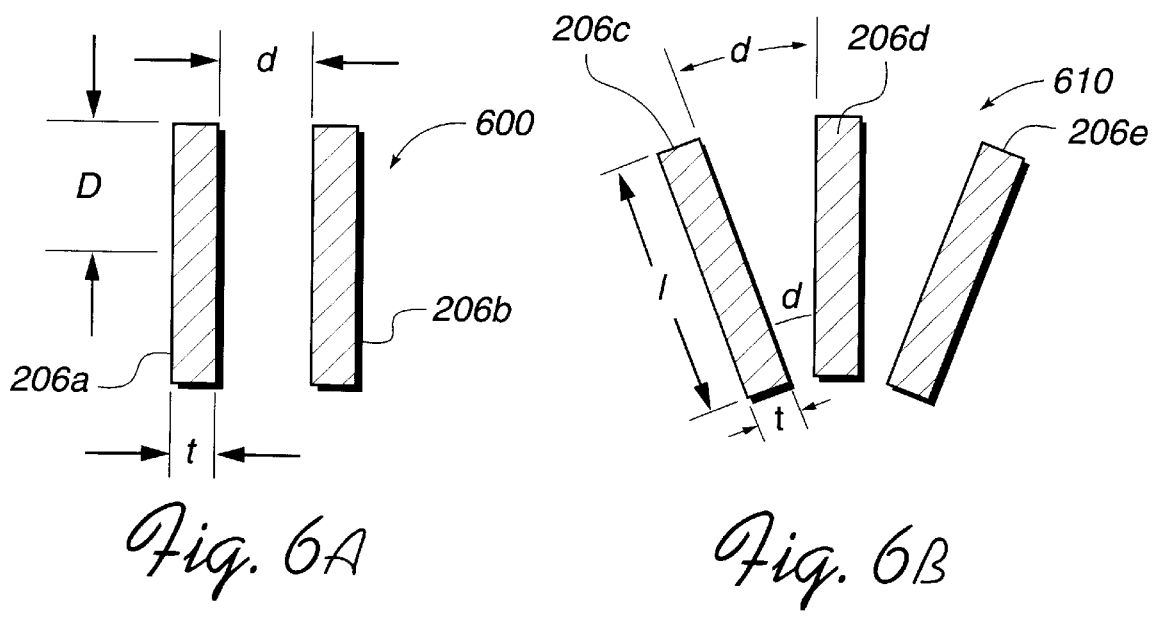

GETTER PUMP MODULE AND SYSTEM

CROSS REFERENCE TO RELATED APPLICATIONS

This application is a continuation-in-part of U.S. patent application Ser. No. 08/332,564, entitled IN SITU GETTER PUMP SYSTEM AND METHOD by inventors D'Arcy H. Lorimer and Gordon P. Krueger, filed Oct. 31, 1994, now U.S. Pat. No. 5,685,963, and which is incorporated herein by reference.

BACKGROUND OF THE INVENTION

This invention relates generally to ultra-high vacuum systems, and, more particularly, to in situ getter pumps used in semiconductor manufacturing systems.

There are a number of processes which require ultra-high vacuum levels of, for example, $10^{-7}$ to $10^{-12}$ Torr. For example, high vacuum physics machines such as cyclotrons and linear accelerators often require a vacuum of the order of $10^{-8}$–$10^{-12}$ Torr. Also, in the semiconductor manufacturing industry, ultra-high vacuums of approximately $10^{-7}$–$10^{-9}$ Torr are often required in semiconductor processing equipment.

Several pumps are often used in series or parallel to achieve ultra-high vacuum levels within a chamber. A mechanical (e.g. oil) pump is often used to reduce the pressure within a chamber to approximately 30–50 millitorr. These are often referred to as "high pressure" pumps since they only pump relatively high pressure gasses. Then, a high- or ultra-high vacuum pump, such as a molecular pump, cryopump, turbo pump, or the like, is used to reduce the pressure to approximately $10^{-7}$–$10^{-9}$ Torr. These are often referred to as "low pressure" pumps since they pump low pressure gasses. The pump-down time for a particular chamber can range from minutes to hours to days depending upon such factors as the size of the chamber, the capacity of the pumps, the conductance from the chamber to the pumps, and the desired final pressure.

In certain ultra-high vacuum applications, getter pumps have been used in conjunction with the aforementioned mechanical, molecular, and cryopumps. A getter pump includes getter materials comprising metals or metal alloys which have an affinity for certain non-noble gases. For example, depending upon the composition and temperature of the getter material, getter pumps have been designed which preferentially pump certain non-noble gases such as water vapor and hydrogen.

For example, getter pumps provided by SAES Getters, S.p.A. of Milan, Italy, typically include getter material encased in a stainless steel container. Getter pumps can operate from ambient temperatures to about 450° C., depending upon on the species of gas to be pumped, the getter composition, etc. A preferred getter material for prior art SAES getter pumps is St 707 getter material (which is an alloy of Zr—V—Fe) and which is produced by SAES Getters, S.p.A. of Milan, Italy. Another such material is St 110™ getter alloy, also available from SAES Getters, S.p.A., which is an alloy of Zr—Al. Some of these prior art getter pumps can be considered in situ pumps in that they are disposed within the high vacuum physics machines.

Some present getter pump designs employ getter devices comprising metal ribbons coated with a powdered getter material such as the St 707 and St 101™ getter alloys just described. The coated ribbons are pleated in a concertina fashion to increase the ratio of exposed surface area to the volume occupied by the coated ribbon, and to increase adsorption of desired gasses. Such pumps are manufactured by SAES Getters, S.p.A., and sold under the trade name SORB-AC®. In addition, recent designs have employed disk-shaped substrates coated with getter material powders. Designs using coated substrates have a drawback in that the total amount of getter material available for sorption is limited to the nominal surface area of the getter device substrate.

It is has been suggested that getter pumps be provided for semiconductor processing equipment. For example, in an article entitled "Non-Evaporable Getter Pumps for Semiconductor Processing Equipment" by Briesacher, et al., and published in *Ultra Clean Technology* 1(1):49–57 (1990), it is suggested that any application which uses getters to purify processed gases for semiconductor processing can also utilize non-evaporable getter pumps for in situ purification and for the selective pumping of impurities.

The aforementioned Briesacher reference discloses that there are two possible operating scenarios for the use of getter pumps in a sputtering system, which is a type of semiconductor processing equipment. The first is the addition of the getter pump to the system to operate in parallel with conventional pumps (e.g. mechanical and cryopumps) of the system. In this scenario, the operation of the system is not modified in any way, and the getter pump merely serves as an auxiliary pump to lower the partial gas pressure of certain components of the residual gas in the chamber. The second scenario requires filling the chamber to a pressure in the range of $3 \times 10^{-3}$ to $6 \times 10^{-3}$ Torr, stopping the argon flow into the chamber, and sealing the chamber. The getter pump is then said to act as an "in situ" purifier for the argon. However, as discussed below, the pump is not truly "in situ" in that the active material is not within the volume of the processing chamber.

In a typical sputtering system, a noble gas (usually argon) is pumped into a chamber and a plasma is created. The plasma accelerates positively charged argon ions towards a negatively charged target, thereby causing material to become dislodged and to settle on the surface of the wafer. Getter pumps are well adapted for use with sputtering systems, since the only desired processing gas is a noble gas which is not pumped by the getter pump. Therefore, the getter pump can remove impurity gases from a sputtering chamber without affecting the flow of the noble gas required for the sputtering process.

The Briesacher reference was primarily an academic analysis of the practicality of using non-evaporable getter pumps in semiconductor processing equipment. Therefore, very little practical application of the theory is disclosed. Furthermore, while the Briesacher article uses the term "in situ" to describe a scenario for the use of a getter pump, it is clear from the description that the getter pump is external to the chamber and is considered "in situ" only in the sense that when the chamber is sealed and when no argon is flowing into the chamber, the volume within the getter pump can be considered to be connected to the chamber volume. According to the analysis presented by Briesacher, a valve must be placed between the getter containment vessel and the main chamber to protect the getter from atmospheric exposure that would deteriorate the getter and require additional regenerations. Such protection is imperative with the strip-type getters discussed in the Briesacher reference. Thus, the getter described by Briesacher is not truly "in situ" in that the getter pump surfaces are within a volume that is connected to the chamber volume through a restrictive throat, which greatly limits the conductance between the chamber and the pump. By "conductance" it is meant herein the ease with which a fluid (gas in this instance) flows from one volume (e.g. the processing chamber) to another volume (e.g. the pump chamber). Conductance is limited by the aperture size between the two chambers, which is typically the cross-sectional area of the throat of the cryopump.

SUMMARY OF THE INVENTION

The present invention provides an improved getter pump module and system that is particularly well adapted for in situ pumping of semiconductor processing chambers.

In one preferred embodiment, the present invention includes getter pumps having a plurality of getter elements, the getter elements comprising porous, sintered getter material having an aperture extending therethrough and a support element extending through the aperture. Titanium or other metal hubs are typically provided in the apertures of the getter elements to provide mechanical support for the getter elements and to enhance thermal transfer between the heating element and the getter elements. The getter elements, which are typically disk shaped, are preferably partially surrounded by a shield which provides thermal isolation between the getter elements and other devices and surfaces within a semiconductor processing chamber, and which also aids in the getter element regeneration process.

In a preferred embodiment, a radiative heater is used to heat the getter material. In another preferred embodiment, the present invention includes getter pumps in which the faces of adjacent getter elements are not parallel, which getter elements include apertures through which a heating element is extended. In preferred embodiments, the apertures define an axis and the getter elements are arranged at angles not perpendicular to the axis. In another embodiment, the apertures are substantially perpendicular to the axis, but the faces of adjacent getter elements are inclined with respect to each other, preferably at equal and opposite angles.

In still another embodiment, the present invention includes a semiconductor processing system comprising a processing chamber, an in situ getter pump having a plurality of getter elements, each having an aperture extending therethrough, and a support element extending through the aperture. The getter pump has an actual pumping speed with respect to the processing chamber which is at least 75% of the theoretical pumping speed of the plurality of getter elements in an unlimited volume.

The present invention also includes a method for processing a wafer which includes the steps of (a) placing a wafer within a processing chamber, the chamber including an in situ getter pump having a conductance of greater than about 75% disposed within the wafer processing chamber, the in situ getter pump including a plurality of getter elements; (b) sealing the chamber; (c) flowing a noble gas into the chamber while simultaneously pumping the chamber with an external low pressure pump and the in situ getter pump, the low pressure pump operative to remove noble gasses from the chamber and which in situ getter pump operative to remove non-noble gasses from the chamber; and (d) processing the wafer in the chamber while flowing the noble gas into the chamber. The present invention also includes the wafer produced by the method of the invention.

In yet another embodiment, the present invention includes a method for pumping a chamber, which includes the steps of (a) sealing the chamber from the external atmosphere; and (b) pumping the chamber with an in situ getter pump disposed within the chamber, the in situ getter pump having a conductance of greater than about 75% and the in situ getter pump being capable of operating at more than one temperature to pump thereby selected non-noble gasses at different getter temperatures.

Additional aspects and advantages of the invention will become more apparent when the following description is read in conjunction with the accompanying drawings.

BRIEF DESCRIPTION OF TEE DRAWINGS

Figure 3:
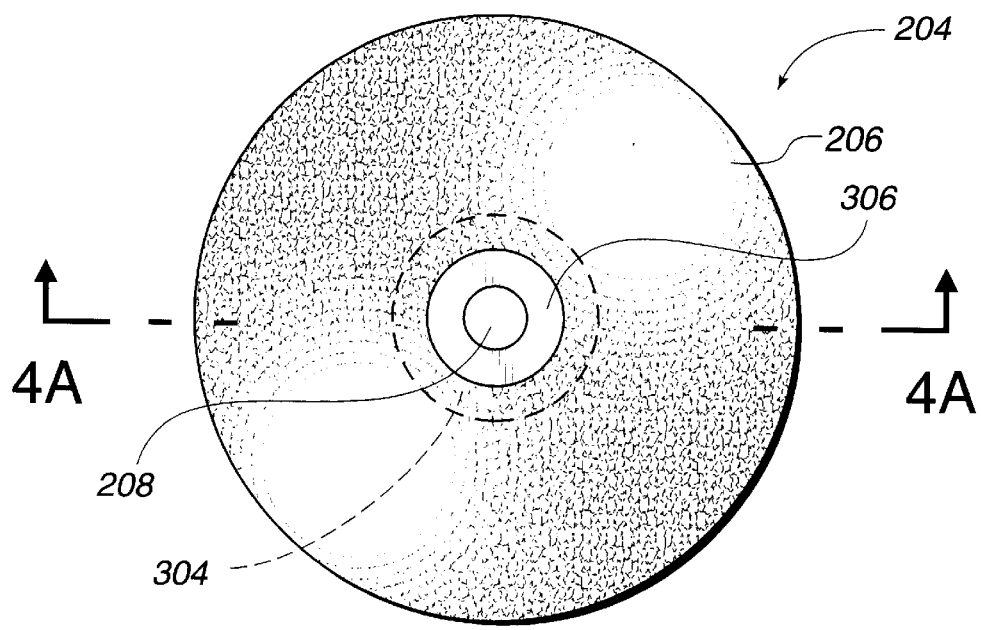
FIG. 3 is a facing view of a getter element of FIG. 2.
Figure 4A:
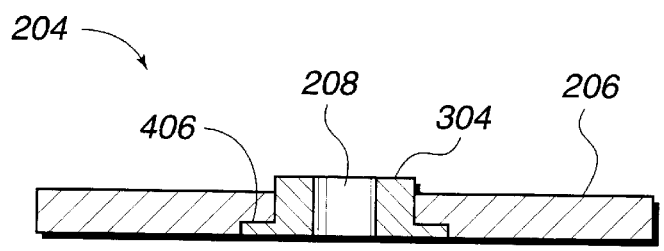
Figure 4B:
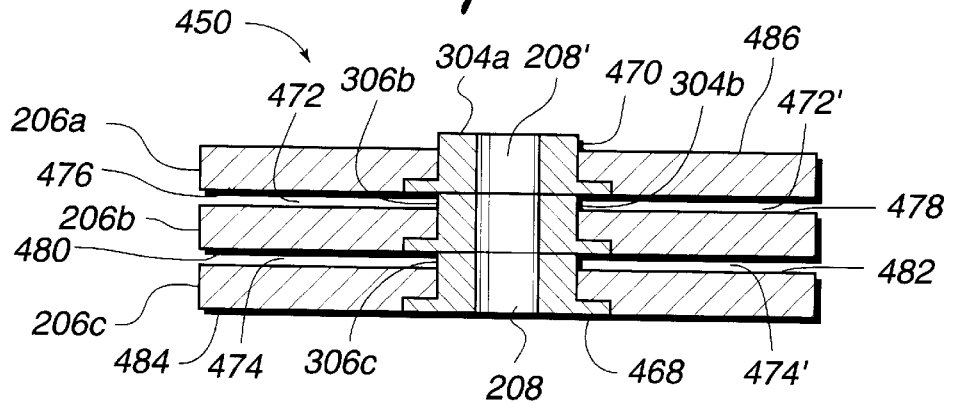

FIGS. 4A and 4B illustrate sectional views of getter elements of the invention. FIG. 4A is a sectional view of a single getter element taken along the line 4A—4A of FIG. 3. FIG. 4B is a sectional view of three abutting getter elements, also along taken the line 4A—4A of FIG. 3.

FIG. 5 is an illustration of the number of collisions between a molecule and two adjacent getter elements of the invention as a function of the distance between the getter elements.

FIGS. 6A and 6B illustrate certain dimensional parameters of the getter elements of the invention. FIG. 6A illustrates dimensional parameters of adjacent getter elements in a arcuate configuration. FIG. 6B illustrates dimensional parameters for adjacent parallel getter elements.

Figure 7:
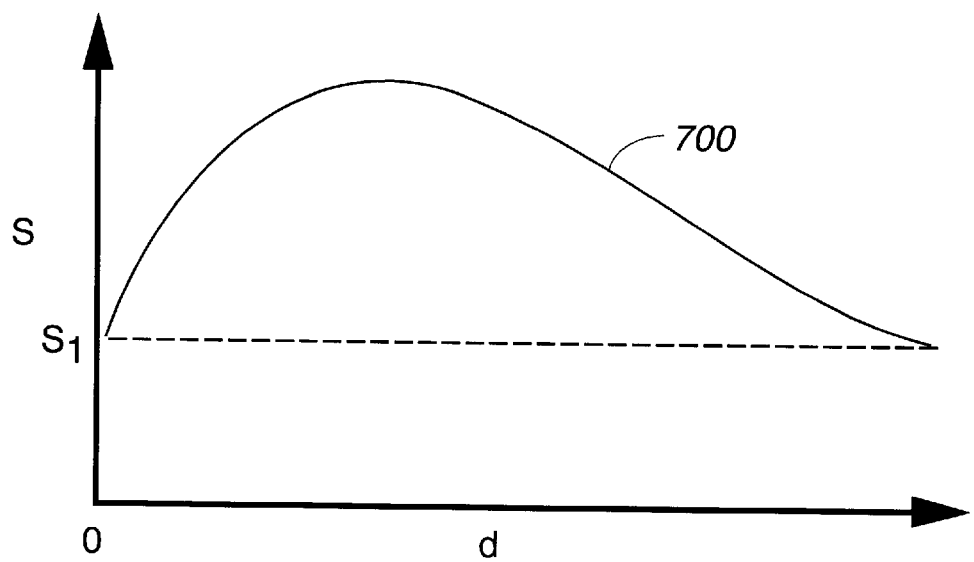

FIG. 7 is a graphical representation of the relationship between pumping speed and the distance "d" between adjacent getter elements.

Figure 8:
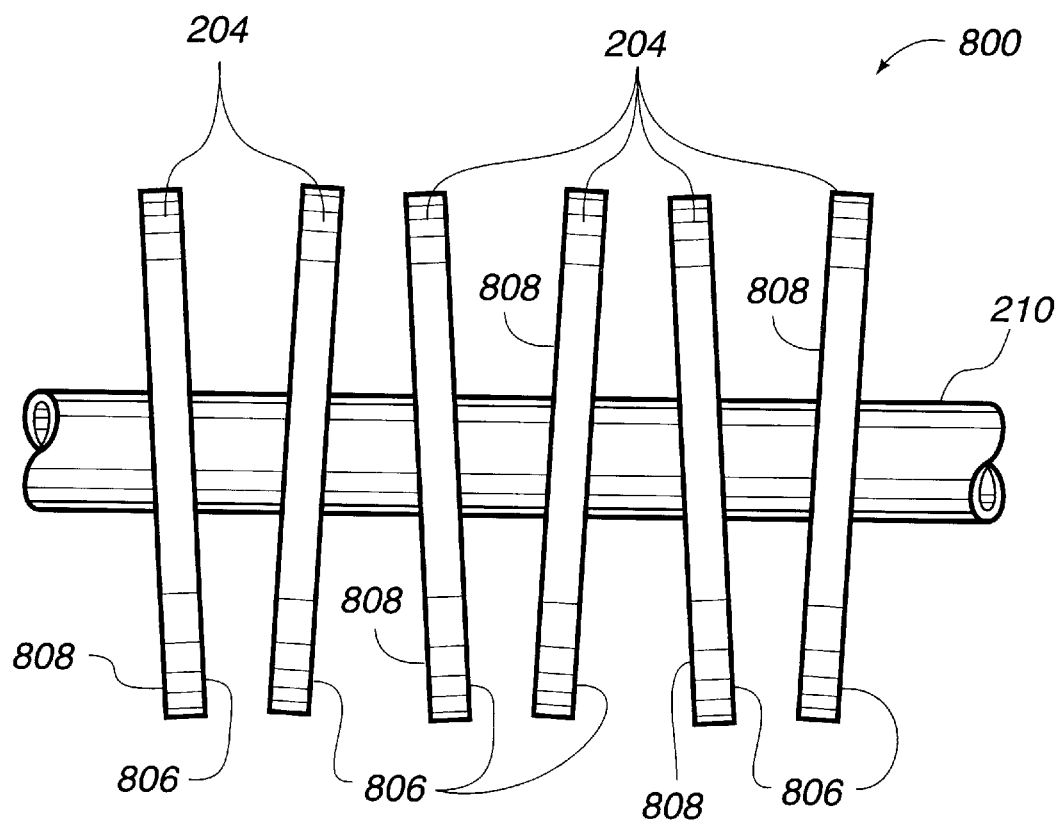

FIG. 8 is an illustration of another embodiment of the invention wherein adjacent getter elements are arranged at opposing angles.

Figure 9:
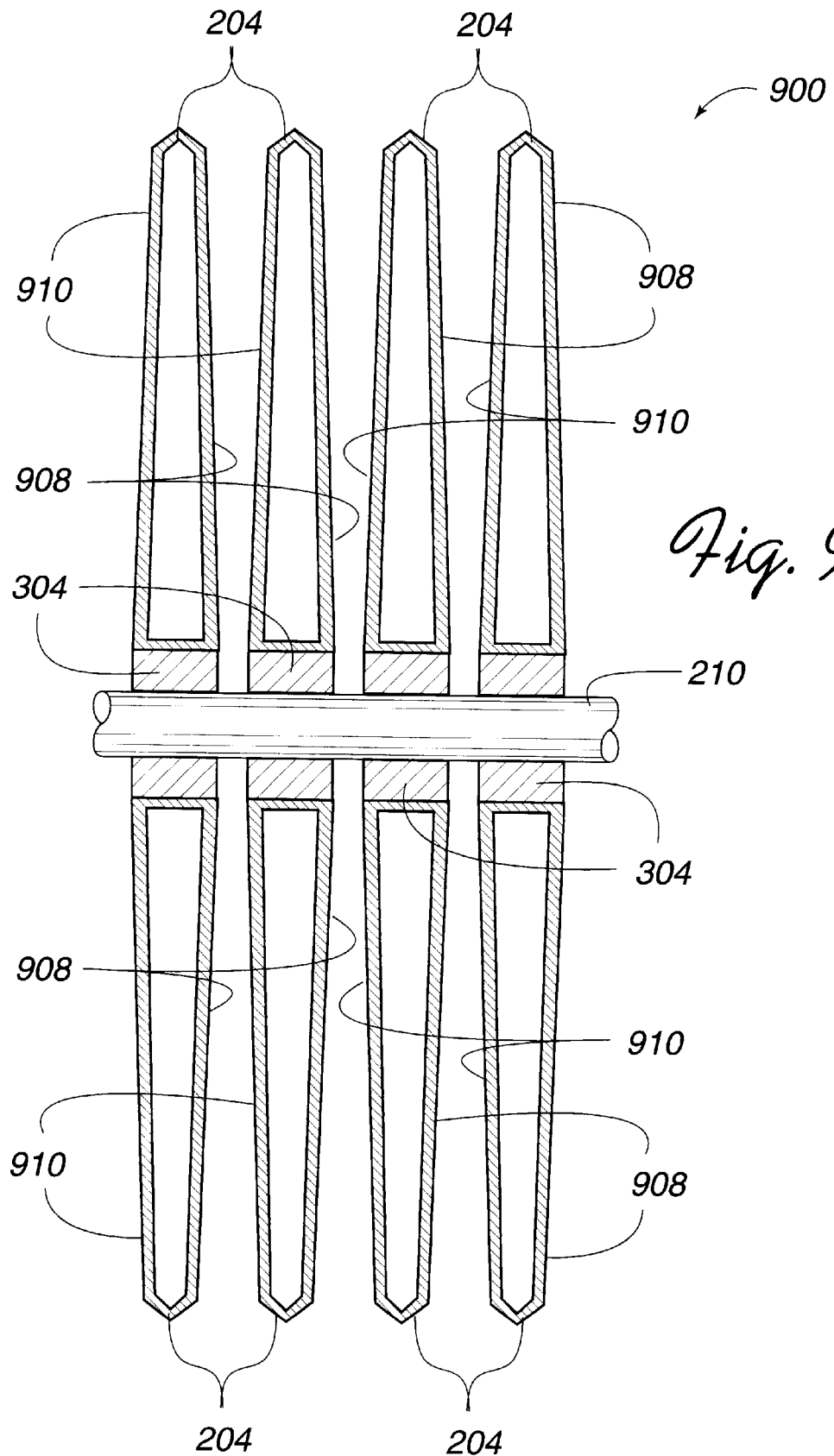

FIG. 9 is an illustration of yet another embodiment of the invention wherein the facing sides of adjacent getter elements are non-parallel.

Figure 10:
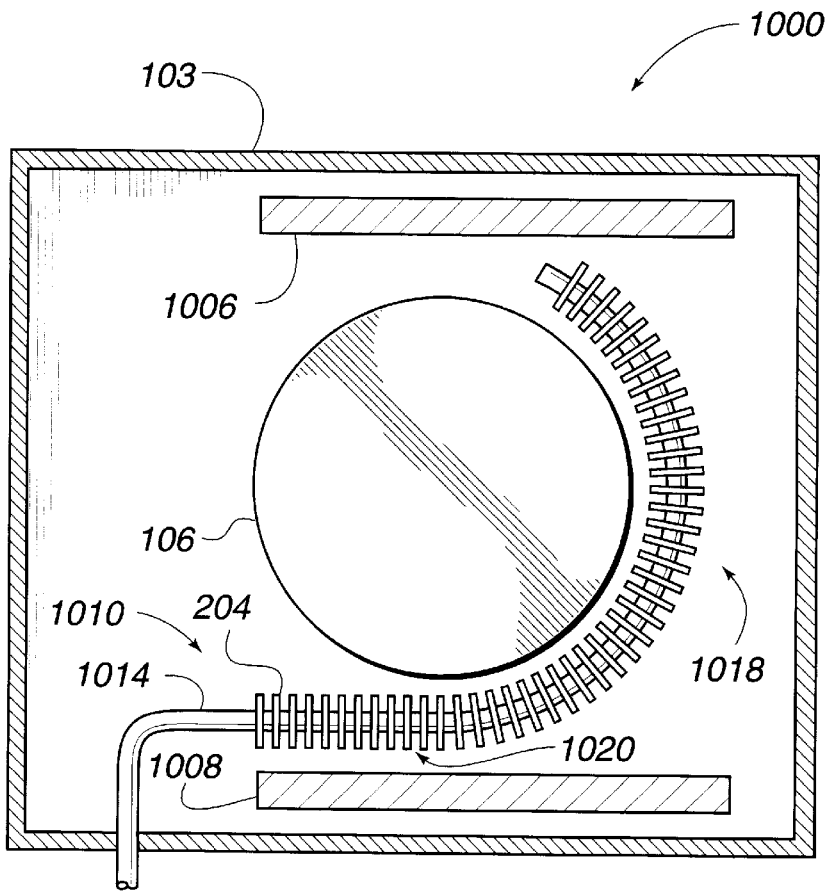

FIG. 10 illustrates an embodiment of the invention wherein an array of getter elements is arranged partially circumferentially around a sputtering platter.

Figure 11:
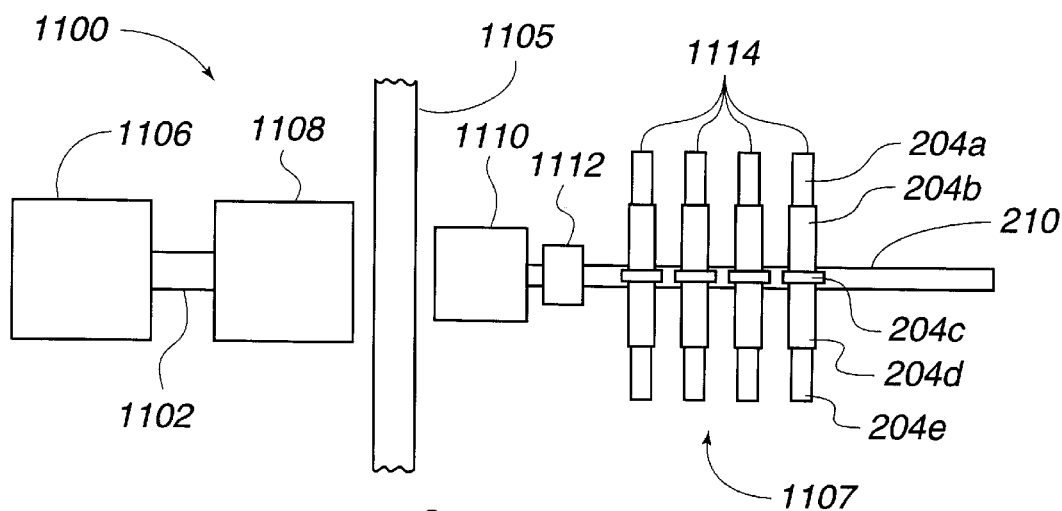

FIG. 11 is an illustration of an embodiment of the invention wherein star-shaped arrays of getter elements are supported on a rotating support element.

Figure 12:
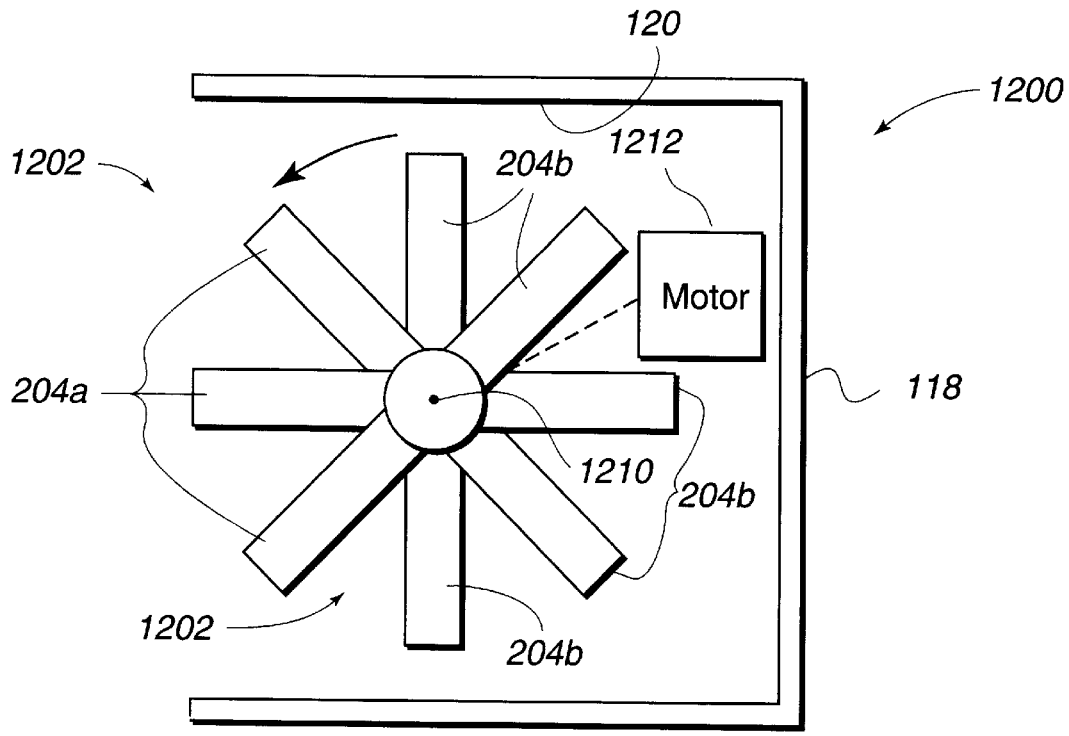

FIG. 12 is a side view of the embodiment shown in FIG. 11, but wherein the getter elements are inside a thermally isolating shield.

Figure 2:
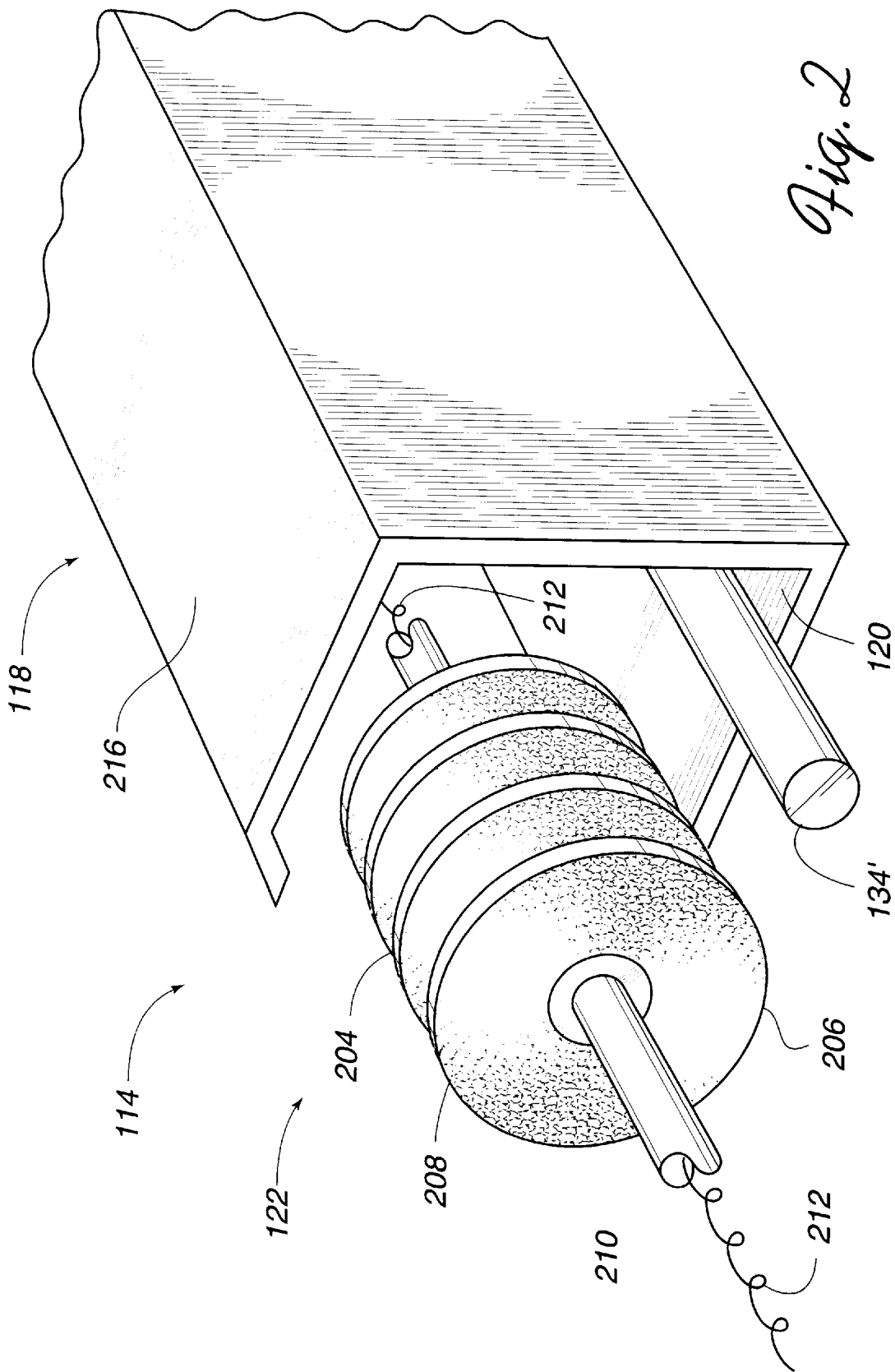
FIG. 2 is a partial perspective view a number of getter elements of the invention and a thermally isolating shield.
Figure 13:
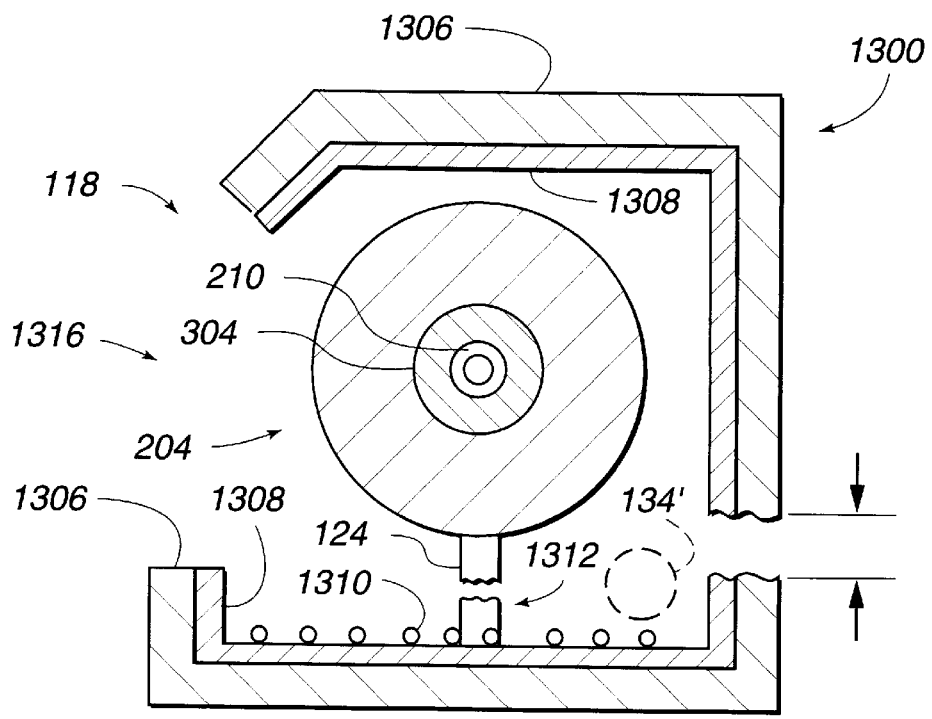

FIG. 13 is a side view of the embodiment illustrated in FIG. 2, but wherein the getter elements are inside a thermally isolating shield.

Figure 14:
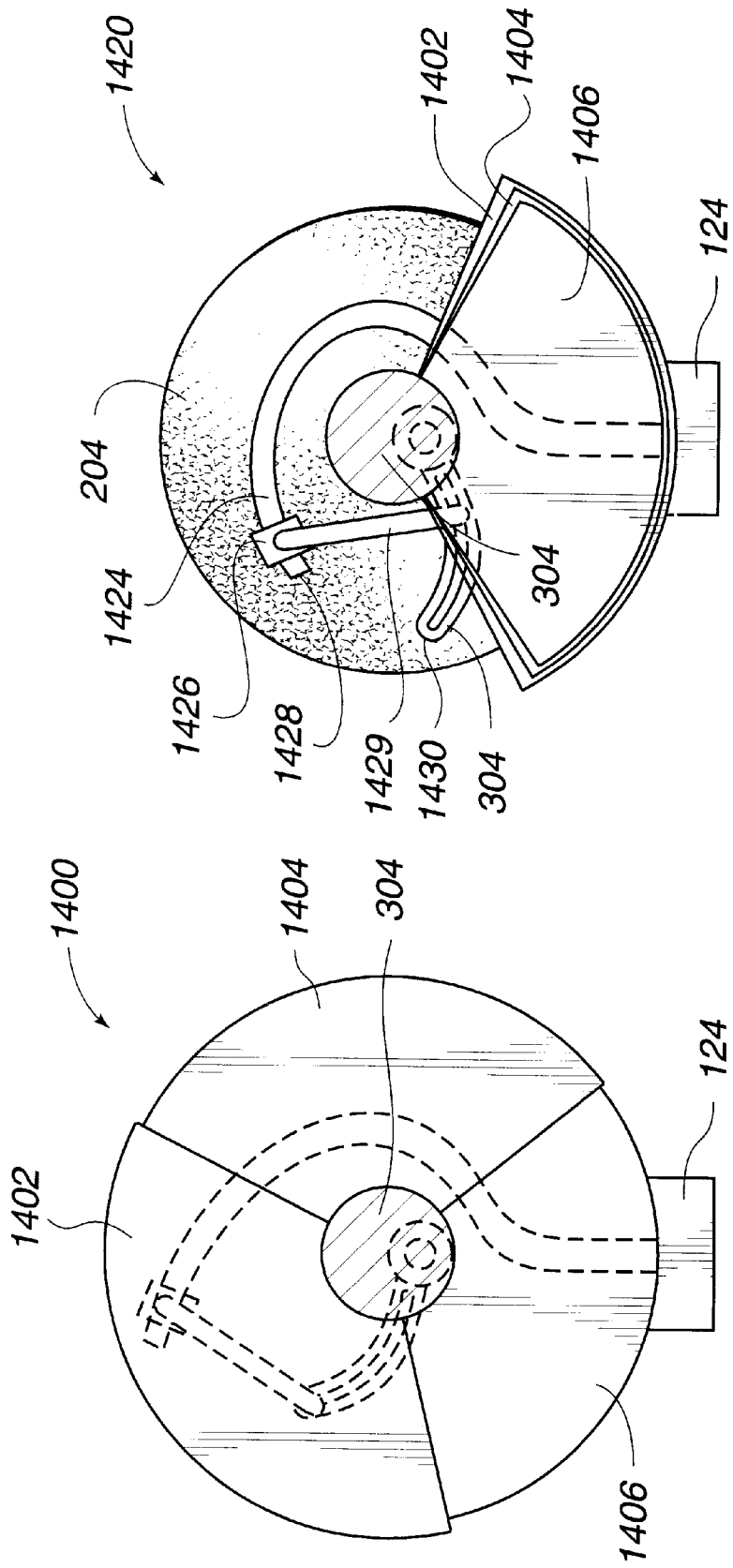

FIGS. 14A and 14B illustrate a side view of a thermally isolating shield of the invention which moves between open and closed configurations. FIG. 14A illustrates a closed configuration in which the getter elements are thermally isolated. FIG. 14B is an illustration of an open configuration in which the getter elements are exposed to the surrounding environment.

Figure 15:
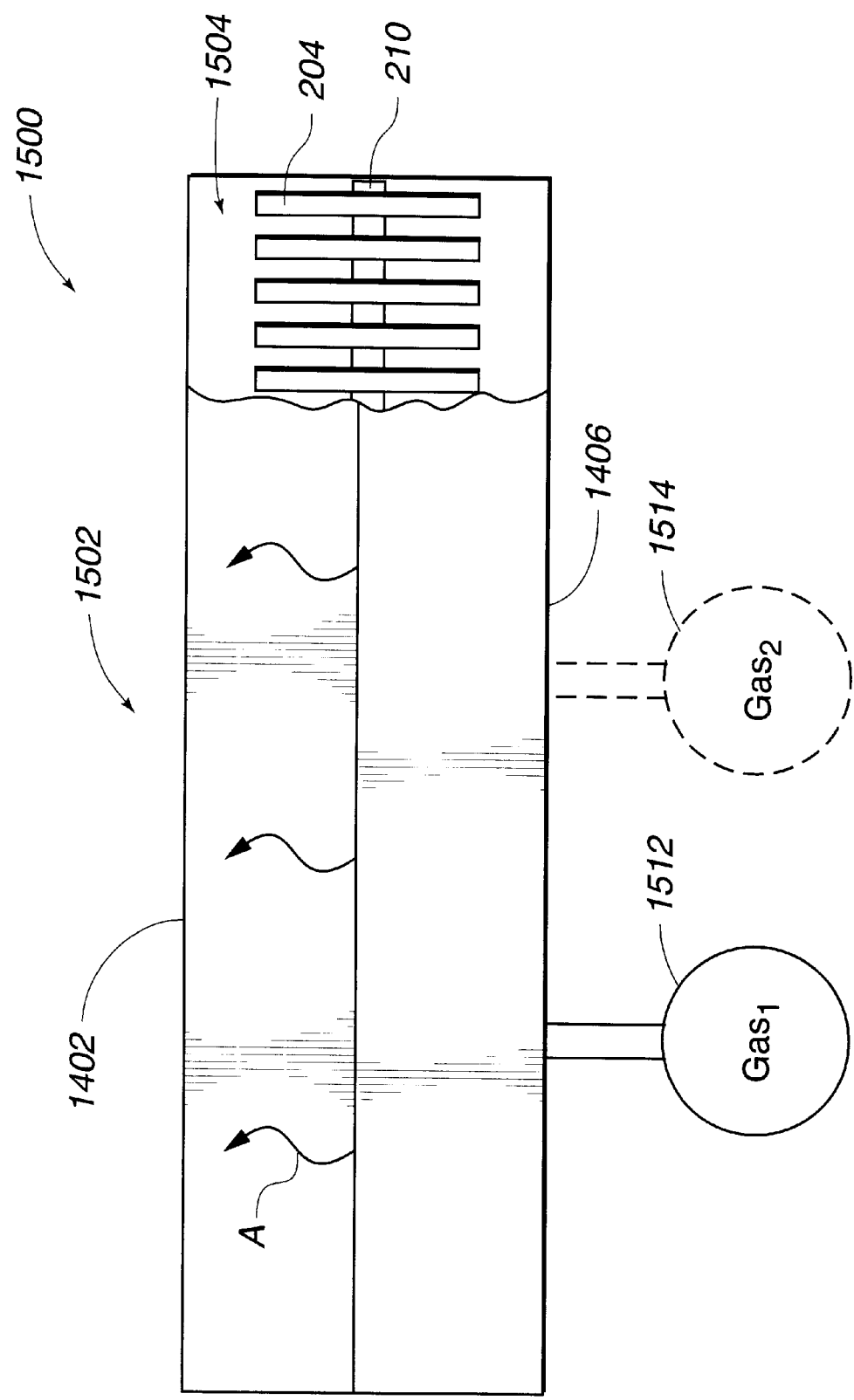

FIG. 15 is a partial cut-away view of the embodiments shown in FIGS. 14A and 14B, further showing gas sources.

DESCRIPTION OF THE PREFERRED EMBODIMENTS

Figure 1:
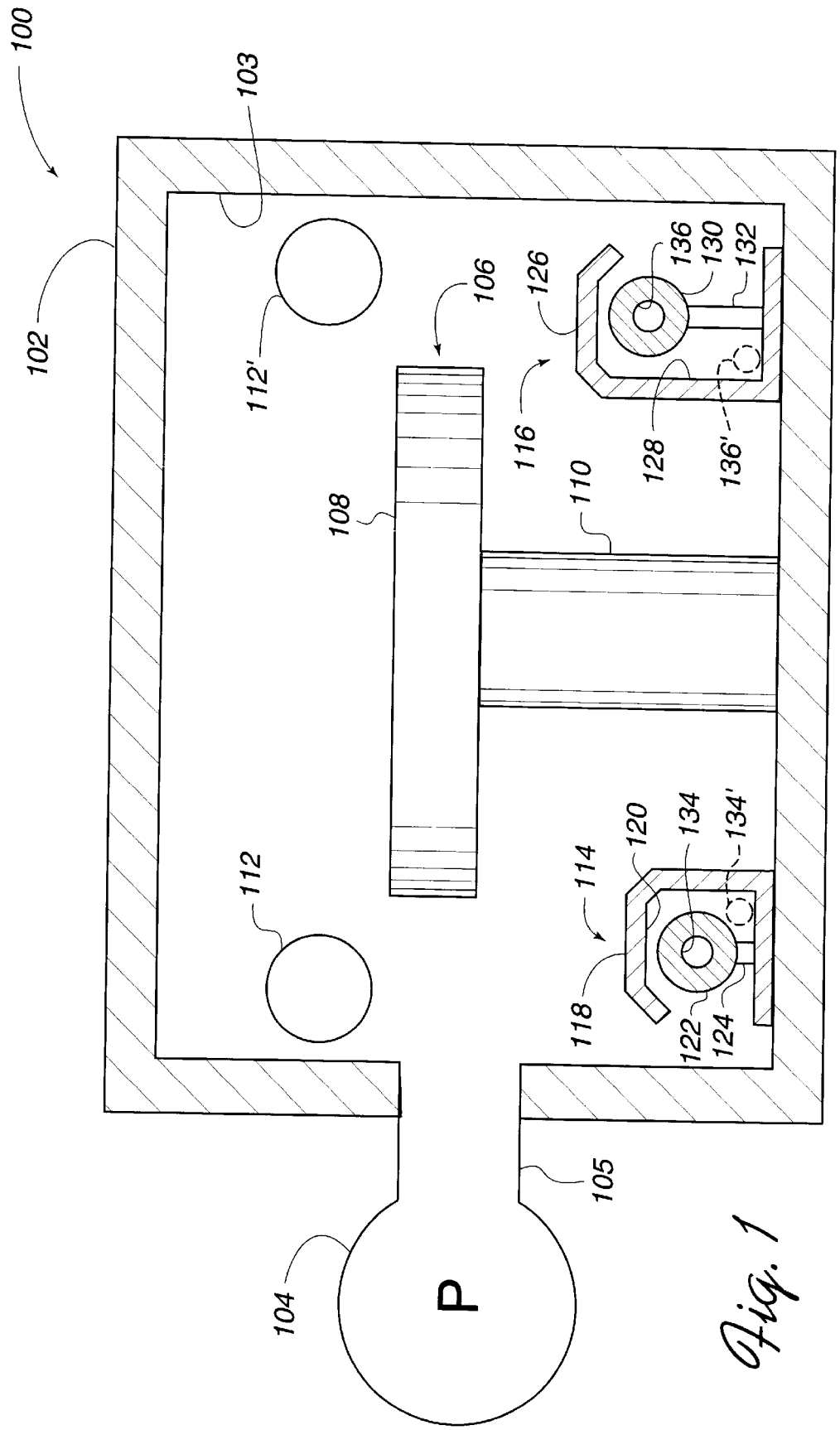
FIG. 1 is a pictorial representation of a semiconductor processing system, including an in situ getter pump module of the present invention.

FIG. 1 illustrates a portion of a semiconductor processing system 100 in accordance with the present invention. The processing system includes a wafer processing chamber 102 having an interior wall 103. An external pump 104 ("P"), such as a cryopump and/or a mechanical pump, is coupled to the chamber by a conduit 105 to reduce the internal atmospheric pressure of the chamber before the getter pump module is operated. Preferably, the internal pressure of the chamber is brought to a level of about $10^{-6}$ bar before the getter pump is activated. Inside chamber 102 is included a sputtering stage 106 which includes a chuck 108 that rests atop a support 110. Also included are heat lamps 112 and 112' and at least one in situ getter pump module such as shown generally at 114 and 116. Chamber 102 typically is one component of a multicomponent semiconductor processing system which includes, inter alia, various power sources, analyzers, cryopumps, plasma generators, low vacuum pumps, high vacuum pumps and controllers. These other components, including their design, manufacture and operation, are well known to those of skill in the art.

As used herein, the phrase "in situ getter pump" will refer to a getter pump where the active elements, i.e. the active getter material, is physically located within the same volume of space as the wafer being processed. As such, the conductance between the in situ getter material and the process chamber is very high compared to the coupling of an external getter pump to the chamber through a gate valve, conduit, the throat of a pump, etc. This results in a relatively high pumping speed. For example, with an in situ getter pump of the present invention, more than 75% of maximum theoretical pumping speed can be achieved, as compared to at best 75% of maximum theoretical pumping speed for an external getter pump coupled to the processing chamber with a gate valve or the like.

The getter pump module 114 and/or 116 is "activated" by heating the getter material of the getter pump to a high temperature, e.g. 450°C. This activation of the getter pump is required because the getter material becomes "passivated" upon exposure to the atmosphere, and may overlap with a "bake-out" step wherein lamps 112 and 112' are used to bake out the chamber to rid the chamber of residual gasses, moisture, etc. However, the bake out period and the activation periods need not coincide.

With continuing reference to FIG. 1, in situ getter pumps 114 and 116 will now be described in greater detail. Pumps 114 and 116 preferably include thermally isolating shields 118 and 126 respectively. The shields may further include thermally reflective interior walls 120 and 128 to enhance the regeneration of the getter elements by reflecting back heat to the getter elements. Within the thermally isolating shields are getter assemblies 122 and 130 which are supported on supports shown generally at 124 and 132. Getter assembly 114 is illustrative of a "low boy" configuration which may be required due to space limitations within the processing chamber. Getter module 126 is an example of a preferred "high boy" configuration which provides a relatively greater conductance between the getter assembly 130 and the interior of the processing chamber due to a relatively greater opening than that which is provided by the low boy configuration.

The getter pumps 114 and 116 further include heaters 134 and/or 134', and 136 and/or 136', respectively, for heating the getter material to temperatures effective to "activate" the getter material as described above, and/or to control the adsorption characteristics of the getter material as is well known in the art. Heaters 134, 134', 136 and 136' can be resistive heaters, i.e., heaters that use at least in part electrical resistance for heating, or radiative heaters, i.e., heaters that employ radiation to effect heating of nearby surfaces.

Preferably, heaters 134 and 136 are resistive heaters and are disposed through an aperture in the getter elements as will be described in greater detail below. It will be appreciated that heaters 134 and 136 can also fulfill a support function, supporting the getter elements in addition to heating the getter material. Heater elements 134' and 136' are preferably radiant heaters and are disposed proximate to the getter material and the walls of the thermally isolating shield. It will be appreciated that heater elements 134' and 136' may be disposed at various locations within the thermally isolating shield. Preferred locations are those from which the heaters can efficiently heat the getter material to the desired temperatures without affecting significantly structures within the processing chamber.

An in situ getter pump in accordance with the present invention is illustrated at 114 in FIG. 2. The pump includes a getter assembly 122 and an elongated, box-shaped thermally isolating shield 118 for thermally isolating the getter assembly from the interior of the semiconductor processing chamber 102. Although the shield 118 is preferred, it can be eliminated if the getter assemblies are positioned or otherwise shielded from the heated surfaces in the chamber.

Getter assembly 202 includes a plurality of disk-shaped getter elements 204, each comprised of getter material 206. The getter elements preferably include a centrally located aperture 208, through which aperture extends a support element 210 to physically support the elements. In a preferred embodiment, the aperture is a substantially cylindrical bore extending through the getter element. Other aperture configurations will be recognized to be equivalent. Support element 210 can farther include a resistive element 212 running through the support element to form a resistive heating element to heat to the getter elements to a regeneration temperature in addition to lower temperatures at which the getter material will remove certain gasses preferentially from the atmosphere as is well known in the art. The support element preferably is of a tubular, cylindrical design formed from stainless steel, and is dimensioned to engage with the aperture to provide contact, including thermal contact, with the getter elements. Support elements are available commercially from various suppliers. Support elements which are effective to act as heating elements are sold commercially by Watlow.

In a preferred embodiment, the heating of the getter material is performed using heater element 134' located proximate to the getter material. Heating element 134' is preferably a radiative heater, e.g., a Sylvania quartz infrared lamp such as available commercially from Osram-Sylvania of Winchester, Ky., USA. Preferably, the heating element 134' runs in a direction substantially parallel to the path defined by the axes of the getter elements, which can be supported by a simple (i.e., unheated) rod, preferably of stainless steel. It will be appreciated that a metal supporting rod can also provide heat to the getter material by conduction. Other arrangements of the heater and getter elements will be apparent to those of skill in the art. For example, the getter elements may be held in other fashions, such as by their edges. The heating element can be a single integral heating element, as shown in FIG. 2, or it can comprise a series of discrete heating elements.

The thermally isolating shield 118 comprises an exterior surface 216 which is effective to block radiant heat from the external heat sources within the chamber from affecting the getter elements. The shield may also include a thermally reflective interior surface 120 facing the getter elements which functions to increase regeneration efficiency by reflecting heat back onto the getter assemblies during their regeneration. In addition, the interior surface of the shield can also serve to prevent heat from the regeneration of the getter elements from reaching surfaces within the chamber outside of the thermally isolating shield 118. In a preferred embodiment, the shields are made from 316 Stainless Steel which as been electropolished to about 25 RA.

A preferred embodiment of a single getter element is shown in FIG. 3 at 204. This preferred getter element comprises a solid, porous, sintered disk of getter material 206 which disk includes a non-getter metallic hub 304 disposed within the aperture of the disk and a non-getter metallic spacer 306. The spacer and hub define an aperture 208 which is preferably cylindrical and dimensioned to receivably engage the support/heating element. In preferred embodiments, both the hub and spacer are made from titanium. As used herein, the term "disk" refers to a getter element having a substantially circular or ovoid outer periphery and a surface area in excess of its thickness. Although a substantially planar getter element is preferred for reasons which will become apparent below, deviation from planarity is also encompassed by the present invention.

By "solid" it is meant that the getter material comprises the body of the getter element, such as described in U.S. Pat. No. 5,320,496 to Manini, et al., entitled "High-Capacity Getter Pump", and which is incorporated herein by reference, as opposed to other getter elements wherein getter material is adhered to a substrate surface. By providing a solid, porous getter disk, pumping efficiency and impurity capacity is greatly increased since molecules can be adsorbed deep into the body of the getter element, rather just on the surface as with prior art getter elements.

The getter elements can be made from a variety of getter materials, depending upon their desired properties. Typical getter materials include alloys of zirconium, vanadium and iron as disclosed in U.S. Pat. Nos. 3,203,901, 3,820,919, 3,926,832, 4,071,335; 4,269,624, 4,428,856, 4,306,887, 4,312,669, 4,405,487, 4,907,948 and 5,242,559; and British Patent No. 1,329,628 and British Patent Application No. GB 2,077,487A; and German Patent No. 2,204,714, each of which is incorporated herein by reference. Additional types of getter materials include, among others, titanium, hafnium, uranium, thorium, tungsten, tantalum, niobium, carbon and alloys thereof.

A preferred getter material comprises a zirconium—vanadium—iron ternary alloy having a weight composition such that the percentages of weights of the three metals, when plotted on a ternary composition diagram fall within a triangle whose vertices lie at a) 75% Zr/20% V/5% Fe; b) 45% Zr/20% V/35% Fe; and c) 45% Zr/50% V/5% Fe. More preferably, the getter material comprises a ternary alloy having a composition of 70% Zr/24.6% V/5.4% Fe by weight, which ternary alloy is sold under as St 707 by SAES GETTERS, S.p.A. Such materials are described in U.S. Pat. No. 4,312,669 and British Patent Application No. GB 2,077, 487A.

Another preferred getter alloy is one made from zirconium and aluminum, comprising about 84% zirconium by weight and 16% aluminum by weight. Such material is sold under the trade name St 101® by SAES GETTERS S.p.A. Still another preferred getter material comprises 17% carbon and 83% zirconium by weight and is sold under the trade name St 171® by SAES GETTERS S.p.A. Yet another preferred getter material comprises 82% zirconium, 14.8% vanadium and 3.2% iron by weight and is sold under the tradename St 172 by SAES GETTERS S.p.A. Another preferred getter material comprises 10% molybdenum, 80% titanium and 10% titanium hydride ($TiH_2$) by weight and is sold under the tradename St 175 by SAES GETTERS S.p.A. Those of skill in the art will appreciate that these getter materials can be prepared by analogy to the descriptions in the above-cited patents and patent applications.

Highly porous getter materials tend to be preferable to less porous materials in that they tend to have higher adsorption capabilities. Such porous getter materials can be prepared in accordance with the descriptions in U.S. Pat. No. 4,428,856, which describes the preparation of porous getter bodies from a mixture of powders including titanium, titanium hydride and a refractory metal chosen from the group consisting of tungsten, molybdenum, niobium and tantalum; British Patent Application No. GB 2,077,487A, which describes the preparation of porous getter material from a mixture of zirconium and the above-described ternary alloy; and German Patent No. 2,204,714 which describes the preparation of a porous getter material comprising a mixture of zirconium and graphite powders.

Preferred getter materials and their preparation are described in British Patent Application No. GB 2,077,487A. The preferred getter materials comprise mixtures of zirconium powder with the above-described ternary alloy in a ratio of between 4 parts zirconium to 1 part ternary alloy and 1 part zirconium to 6 parts ternary alloy by weight. More preferably, the zirconium:ternary alloy ratio is between 2:1 and 1:2. The ternary alloy can be formed, for example, by combing zirconium sponge with commercially available iron-vanadium alloy (Murex, United Kingdom) in a fusion furnace under reduced pressure until molten, cooling the molten material, and milling the resulting solid to a powder.

Formation of the getter elements can be accomplished using a process which comprises placing a hub (described below) into a getter element mold, adding the alloy and the zirconium powders and sintering the material at a temperature between about 1000° C. and 1,100° C. for a period of between about 5 minutes and about 10 minutes.

FIG. 4A shows a cross section of the getter element shown in FIG. 3 taken along the line 4A—4A at 204. As shown in FIG. 4A, the getter element includes a porous sintered disk of getter material 206 which disk includes a hub 304 of non-getter material disposed in an aperture within the disk. The hub includes a foot 406 and a central aperture 208. Preferably, the foot of the hub is substantially flush with the disk surface while the opposite end of the hub extends above the surface of the disk. However, it will be appreciated that either or both ends of the hub may extend above the disk.

The diameter of a preferred getter element of the present invention is about 25.4 millimeters (mm). The thickness of the getter disk is about 1.3 mm. A preferred hub embodiment includes a substantially circular foot having a diameter of about 8.0 mm, and a foot height of about 0.3 mm; and a substantially circular raised portion extending from the foot, the raised portion having a diameter of about 6.0 mm and a height of about 1.7 mm (i.e., the total height of the hub is about 2.0 mm). Thus, in is preferred embodiment the raised portion extends above the getter material at a height of about 0.7 mm from the disk surface. The diameter of the aperture extending through the hub that receives the heating element or support is about 3.8 mm.

In preferred embodiments, getter pumps are constructed from a plurality of getter disks which are placed adjacent each other along the axes defined by the disks' apertures. Such an embodiment is illustrated in FIG. 4B at 450. As shown in FIG. 4B, the getter elements includes a first disk 206a, a second disk 206b, and a third disk 206c. Each disk is aligned such that a central aperture 208' is formed by the apertures of the individual disks. In order to maximize the available surface area, it is preferable to stack the disks such that the hub of any one disk is substantially touching the spacer of an adjacent disk. Thus, hub 304a of disk 206a is shown in contact with spacer 306b of disk 206b, and hub 304b of disk 206b is in contact with spacer 306c of disk 206c. It will be appreciated that the spacers provide gaps through which the getter materials can interact with the atmosphere to which the getter pump is exposed. Such gaps are illustrated at 472 and 472', which are formed by opposing faces 476 and 478; and gaps 474 and 474', which are formed by opposing faces 480 and 482. As shown in the Figure, faces 484 and 486 of the getter elements at the ends of the stack are free. Typically, however, there will be many getter elements stacked to provide many of such gaps.

Referring to FIG. 5, the parameters required for optimal pumping function will be discussed. As it is well known in the art, the efficiency of a getter pump is related to the distance between the getter elements. If the getter elements are spaced too widely, gas molecules will pass between the walls after a few, or no collisions with the getter material. This is illustrated at 500 where adjacent getter elements 204b and 204a are spaced at a distance which allows molecule 506 to collide with either opposing face of the getter elements only a few times along path 508 before passing between the disks without being adsorbed. Conversely, as the getter elements are brought together, more collisions between the molecule and the getter element surfaces occur, thereby increasing the likelihood that the molecule will be trapped by the getter material. This is illustrated at 510 where opposing getter elements 204d and 204c are spaced close enough that molecule 516 collides several times along the opposing getter element faces along path 518. Each time the molecule collides with a getter element surface, there is a certain probability that the molecule will stick to the surface and become absorbed therein. Thus, a greater number of collisions between the molecule and the surface will yield a correspondingly greater likelihood that the molecule will be trapped by the surface. However, if the getter elements are placed too close together (e.g., if they abut each other), the edge area of the disk will become the dominant pumping surface, which is less effective than the facing surfaces of the disks.

In view of the foregoing, preferred getter element designs will take advantage of the above-described properties to optimize the efficiency of the getter pump by employing various geometries, see, e.g., WO 94/02957, published Feb. 3, 1994, to Ferrario, et al., and Technical Paper TP 202, American Vacuum Society 39th National Symposium (1992), both of which are incorporated herein by reference. The relevant parameters to be considered are shown in FIG. 6A by reference to opposing disks 206b and 206a. The relevant parameters include the disk radius "D," inter-element spacing "d" and disk thickness "t." In some embodiments, the getter elements will be arranged in a fan pattern such as that shown at 610 in FIG. 6B. There, disks 206e, 206d, and 206c are arranged in an arcuate pattern having an angle "α" between the disks. Thus, the inter-element spacing d will be related to the angle α and the length l of the getter element.

The above-described relationship between the arrangement and dimensions of the getter elements and the efficiency of the getter pump is illustrated in FIG. 7 along path 700, which shows the relationship between pumping speed "S" and the inter-element distance "d" as determined by experimental tests of disk performance as a function of the above-described parameters. As seen in FIG. 7, when the getter elements are touching, i.e., when d=0, the pumping speed is at the value "$S_1$." As the inter-element spacing increases, the pumping speed increases until reaching a maximum at which point further increases in the distance between getter elements allow fewer molecular reflections between the disks; thereby increasing the probability that the molecule will fly between the surfaces of the disks. By extending the distance between adjacent getter elements sufficiently, the pumping speed can be decreased below that for the case where all of the getter elements are touching. The optimum parameters for disk spacing can be determined by plotting the pumping speed versus the disk spacing and finding the maximum of the resulting distribution. For the aforementioned 25.0 mm diameter disk shaped getter elements, a spacing of about 0.7 mm is preferred for pumping $H_2$, a gas commonly used in semiconductor processing operations. It will be appreciated that other disk spacings may be preferred for pumping impurity gases other than $H_2$.

A preferred embodiment employing the above-described relationship between getter element spacing and pumping speed is illustrated in FIG. 8 at 800. There, the opposing faces of the adjacent getter elements are not parallel with respect to each other, relative to the axes defined by the apertures of elements 804, which apertures are aligned along an axis that is parallel to heating element 210. As will be appreciated from the illustration, the axes of elements 204 are arranged such that the surface planes 806 and 808 are not perpendicular to the axis defined by the apertures. In a preferred embodiment, the apertures of the adjacent getter elements are inclined along the axis at opposing angles, thus allowing adjacent getter elements to form a partial "V" shape.

FIG. 9 shows an alternative embodiment at 900 wherein adjacent getter elements 204 include hubs 304 having apertures that are substantially perpendicular to their common axis. In this embodiment, the faces of the adjacent getter elements are inclined relative to the axis formed by their apertures. In preferred embodiments, the opposing faces of the getter elements, shown generally at 908 and 910, are inclined relative to the axis and at opposing angles. Such an arrangement provides for a steady narrowing of the inter-element distance proceeding from the peripheral edges of the getter elements toward their hubs. Preferred angles and distances are described in Briesacher, et al., *Ultra Clean Technology* 1(1):49–57 (1990), which is incorporated herein by reference.

Certain embodiments of the invention include straight and curved getter pump segments to accommodate the space restrictions inherent in semiconductor processing chambers. As shown in FIG. 10 at 1000, a processing chamber having a wall 103, heat lamps 1006 and 1008, and a sputtering stage 106, includes a getter pump 1010 having getter elements 204 supported on heating element 1014. The getter pump includes curved portions 1018 and straight portions 1020 which allow placement of the getter pump in close proximity to the sputter stage 106. It will be appreciated by those of skill in the art that maintaining close proximity of the getter pump to the stage facilitates the pumping of non-noble gasses, and produces a low-impurity partial pressure where such a partial pressure is most important-near the wafer being processed.

It will be further appreciated by those skilled in the art that the placement of the getters within an elongate, box-shaped shield structure such as shown in FIG. 2 can provide uneven exposure of the getter elements, with those portions of the getter elements closer to the aperture receiving greater exposure to the chamber atmosphere than those portions of the getter elements closer to the interior of the shields. Such an arrangement therefore could underutilize the sorptive capacity of the getter elements.

An embodiment of the getter segments of the present invention that would substantially avoid this potential problem is illustrated in FIG. 11 at 1100. There, a shaft 1102 of a motor 1106 is coupled to a magnetic coupling device 1108 disposed on the outer side of a chamber wall 1105. A second magnetic coupling device 1110 is disposed on the other (inner) side of the chamber wall 1105. The magnetic coupling device 1110 is coupled to the support/heater element 210 by a connector 1112. Optionally a heater element (not shown) external to the getter elements may be used with support/heater element 210.

In this alternate embodiment, getter pump module 1107 comprises a plurality of star-shaped getter assemblies 1114, which assemblies each include a hub having a centrally located aperture and a plurality of getter elements 204a, 204b, 204c, 204d and 204e extending radially from the hub. The getter elements in this particular embodiment of the invention are substantially paddle shaped, i.e., the getter elements have a substantially rectangular or fan shaped cross section along an axis which is longer than the width or depth of the getter element. The getter assemblies are supported by a heating element 210 which rotates in the direction indicated.

Those skilled in the art will appreciate that such an embodiment will increase the utilization of the capacity of the getter elements, as illustrated in FIG. 12 at 1200, where rotating getter pump 1202 is placed inside shield 118. As the Figure illustrates, getter elements 204a are in close proximity to the aperture of shield 118, thereby receiving greater exposure to the chamber atmosphere relative to getter elements 204b which are in close proximity to the interior shield wall 120. Rotation about central hub 1210 using motor 1212 allows the lesser exposed getter elements 204b to be moved forward toward the aperture while the more exposed getter elements 204a are moved toward the rear of the shield. Thus, the exposure across all of the getter elements is more uniform.

Referring back to FIG. 2, it will be noted that in preferred embodiments, a thermally isolating shield is provided to isolate thermally the getter pump from the processing chamber. Such isolating is advantageous as it protects the getter elements from the effects of the heat lamps that are used to "bake-off" residual gases from the surfaces of the walls and other components in the processing chamber, and, conversely, to protect the components in the chamber from heat released from the getter pump during regeneration of the getter elements.

Referring now to FIG. 13, a thermally shielded getter pump is illustrated at 1300. The shielded getter pump includes a box-like thermally isolating shield 118 shielding getter elements 204, which getter elements are supported by a support 124. The thermally isolating shield preferably comprises an outer surface 1306 and a thermally reflective inner surface 1308 which inner surface faces the getter elements 204. In preferred embodiments, the thermally isolating shield includes a floor shown generally at 1312 which catches various grains of getter material such as shown at 1310, which grains fall from the getter elements during normal operation. The thermally isolating shield will include an aperture such as shown at 1316 to allow contact between the atmosphere in the processing chamber and the getter elements. The shields are preferably made from a stainless steel material, such as "316 Stainless Steel", and the interior surface of the shields may be coated or plated (such as with nickel) to enhance reflectivity. Alternatively, the shield may be polished or electropolished to enhance reflectivity, reduce porosity (which reduces gas and moisture adsorption), and minimize particulate contamination. Within central hub 304 is disposed support/heater element 210. Optionally, an external heater 134' can be used.

In some embodiments, the thermally isolating shield is an elongate, stationary box shaped structure which may be fixed to one or more surfaces of the chamber interior. In some embodiments, the getter elements will be spaced relatively uniformly between the top, sides and bottom of the thermally isolating shield. Such an embodiment is commonly referred to as the aforementioned "low boy" structure. In other embodiments, the spacing between the getter elements and the floor of the thermally isolating structure is larger than the spacing between the getter elements and the remaining sides of the thermally isolating shield. Such embodiments are typically referred to as the aforementioned "high boy" structure. These embodiments are denoted in FIG. 13 by the parameter "1". Preferably, 1 is about 0 mm for the "low boy" configuration and between about 13 mm and about 25 mm for the "high boy" configuration.

A second shield embodiment including a moveable shield is illustrated in FIGS. 14A and 14B. Such a moveable shield minimizes conductance loss by allowing substantially all of the getter elements to be exposed to the chamber atmosphere simultaneously, and yet can isolate the getter elements as desired for regeneration, system maintenance, during bakeout, etc. As illustrated in FIG. 14A of 1400, a moveable shield embodiment wherein the shield is in a closed position, i.e., all of the shield elements 1402, 1404 and 1406 are covering the getter elements, is described. The shield elements rotate about hub 304 which hub is supported by support 124. The movable shield elements are, again, preferably made from stainless steel.

FIG. 14B illustrates an open position of the shield at 1420 in which getter element 204 is exposed substantially to the chamber atmosphere. The mechanism for opening and closing the shield is also illustrated. In a preferred embodiment, the mechanism for opening and closing the shield comprises a flexible tube 1424 which tube includes a ring 1426 coupled to a one way valve 1428. The ring is further pivotably coupled to the proximal end of a rod 1429, which rod is slideably coupled to the grooved extension of a gear 1430 which extension slideably receives the distal end of the rod. The geared portion of gear 1430 is engaged with a smaller gear (not shown) which smaller gear is coupled to the shields 1402, 1404 and 1406. When the tube is charged with gas and straightens, the rising of collar 1426 causes a rotation of gear 1430 which in turn initiates a larger rotation in the smaller gear thereby creating a rotation of the shields about hub 1408 to a closed position. Conversely, when the tube is discharged and assumes its deflated position, the lowering of ring 1426 causes a rotation of the gears in the reverse direction, opening the shields. In this fashion, the shielded getter pump can be opened and closed remotely. However, it will be appreciated that various mechanical, electrical, hydraulic and/or pneumatic mechanisms can be adapted to achieve the same result.

Another view of the embodiment just described is illustrated in FIG. 15 at 1500 which shows the shielded getter pump 1502 and the getter elements 204 and heating element 210 in a partial cut away at 1504. The shield elements are shown at 1402 and 1406. A gas supply for operating the mechanism for opening and closing the shield is shown at 1512. A second, option al, gas supply (preferably nitrogen) for providing a positive pressure relative to the chamber's atmospheric pressure of a gas is also shown at 1514. Preferably, the gasses supplied to the getter pump are inert gasses or nitrogen. In this fashion, the movable shield can be closed (by moving the shield elements in the direction of arrow A) and a nitrogen purge will isolate the getter elements from the ambient environment. Nitrogen is also a preferred gas for providing a "passivating layer" over the getter element surfaces to protect the getter elements from more harmful gasses, such as oxygen, as the nitrogen layer can be readily removed from the elements by heating (i.e., regeneration). This is particularly useful during system maintenance or repair where the chamber is open to the atmosphere, since protecting the getter elements will enhance their useful life spans.

Thus, it will be see n that the present invention addresses substantially the need to provide an apparatus and method for creating high-vacuum conditions. Using the method and apparatus of the invention as described herein, high-vacuum states, such as desired in semiconductor processing chambers, can be created more efficiently and effectively than heretofore possible.

Although the invention has been described with reference to certain examples and embodiments, it will be appreciated by those of skill in the art that alternative embodiments can be made which do not depart from the scope or spirit of the invention. It is therefore intended that the following appended claims be interpreted in light of the true spirit and scope of the present invention.

What is claimed:

1. A getter pump comprising:
   a plurality of solid getter elements of porous, sintered getter material, each of said getter elements having an aperture extending therethrough;
   a metal rod extending through said apertures and supporting said getter elements; and
   a radiative heater for heating said getter elements and said metal rod, said radiative heater providing radiation which impinges on at least some of said getter elements.

2. A getter pump as recited in claim 1, wherein said getter elements each further include a hub disposed within said aperture, wherein each of said hubs is provided with a hub aperture receptive to said metal rod.

3. A getter pump as recited in claim 2, wherein said hub aperture is cylindrical.

4. A getter pump as recited in claim 3, further comprising a spacer engaged with said metal rod and disposed between adjacent getter elements.

5. A getter pump as recited in claim 4, wherein said spacer is integral with said hub.

6. A getter pump as recited in claim 5, wherein said hub and spacer are made from a titanium-based material.

7. A getter pump as recited in claim 2, wherein heat from said radiative heater in combination with heat conducted by said metal rod heats said getter elements to a regeneration temperature.

8. A getter pump comprising:
   a plurality of getter elements, each of said getter elements having an aperture extending therethrough;
   a metal rod extending through said apertures and supporting said getter elements;
   a means for radiantly heating said getter elements and said metal rod, said heating means providing radiation which impinges on at least some of said getter elements; and
   a thermally isolating shield proximate to said getter elements and at least partially surrounding said getter elements.

9. A getter pump as recited in claim 8, wherein said means for radiantly heating said getter elements and said metal rod comprises an infrared lamp.

10. A getter pump as recited in claim 8, wherein said getter elements are substantially disk-shaped members.

11. A getter pump as recited in claim 10, wherein said getter elements are porous, sintered disks of getter material each having a centrally located hub of non-getter material.

12. A getter pump as recited in claim 8, wherein said shield is a fixed shield.

13. A getter pump as recited in claim 12, wherein said fixed shield comprises a reflective surface which faces said getter elements.

14. A getter pump as recited in claim 13, wherein said fixed shield is an elongated box-shaped shield having at least one open side.

15. A getter pump as recited in claim 12, wherein said fixed shield causes no more than a 25% conductance loss between said getter elements and an environment surrounding said fixed shield.

16. A getter pump comprising:
   a getter assembly including a hub having a centrally located aperture, and a plurality of getter elements extending substantially radially from said hub;
   a metal rod extending through said aperture of said hub to support said getter elements; and
   a radiative heater for heating said getter elements and said metal rod, said radiative heater providing radiation which impinges on at least some of said getter elements.

17. A getter pump as recited in claim 16, wherein said getter assembly is one of a plurality of getter assemblies supported by said metal rod.

18. A getter pump as recited in claim 17, further including a thermally isolating shield surrounding at least partially said getter elements and said radiative heater.

19. A getter pump as recited in claim 18, wherein said shield in an elongated box-shaped shield.

20. A getter pump, comprising a plurality of solid porous getter elements of porous, sintered getter material, each of said getter elements having an aperture therethrough, a metal rod extending through said apertures and supporting said getter elements, and a radiative heater for heating said getter elements and said metal rod, said radiative heater providing radiation which impinges on at least some of said getter elements, said getter elements and said radiative heater being at least partially enclosed within a thermally isolating shield, said shield having walls proximate to said getter elements and said radiative heater, wherein said getter pump has at least about a 75% conductance with a proximate volume to be pumped.

21. A getter pump as recited in claim 20, wherein said heater is a resistive heater.

22. A getter pump comprising a plurality of getter elements having a common support structure, said suppport structure comprising a metal rod which extends through an aperture in each of said getter elements, each of said getter elements comprising a solid getter body of porous, sintered getter material, and a radiative heater for heating said getter elements and said support structure, said radiative heater providing radiation which impinges on at least some of said getter elements, wherein said support structure is coupled with a thermally isolating shield.

23. The getter pump of claim 22, wherein said radiative heater is an infrared lamp.

24. The getter pump of claim 23, wherein each of said getter elements further comprises a hub engaged with said getter element, each said hub being provided with an aperture.

* * * * *

UNITED STATES PATENT AND TRADEMARK OFFICE
CERTIFICATE OF CORRECTION

PATENT NO. : 5,911,560
DATED : June 15, 1999
INVENTOR(S) : Krueger et al.

It is certified that error appears in the above-identified patent and that said Letters Patent is hereby corrected as shown below:

Column 4,
Line 9, please replace "TEE" with -- THE -- as filed in the original application page 6, line 1.

Column 6,
Line 31, please replace "farther" with -- further -- as filed in the original application page 9, line 37.
Line 49, please replace "Ky" with -- KY -- as filed in the original application page 10, line 12.

Column 12,
Line 63, please replace "option al" with -- optional -- as filed in the original application page 18, line 5.

Column 13,
Line 11, please replace "see n" with -- seen -- as filed in the original application page 18, line 15.

Column 14,
Line 48, after "said" please insert -- radiative -- as filed in the amendment dated September 27, 1997.
Line 49, please replace "a resistive heater" with -- an infrared lamp -- as filed in the amendment dated September 27, 1997.

Signed and Sealed this

Thirtieth Day of October, 2001

Attest:

NICHOLAS P. GODICI
Attesting Officer
Acting Director of the United States Patent and Trademark Office